(12) United States Patent
Wood

(10) Patent No.: US 6,424,930 B1
(45) Date of Patent: Jul. 23, 2002

(54) DISTRIBUTED PROCESSING SYSTEM FOR COMPONENT LIFETIME PREDICTION

(76) Inventor: Graeme G. Wood, 2 High Pines, Homefield Rd., Warlingham, Surrey (GB), CR6 9HQ (*) Notice: Subject to any disclaimer, the term of this patent is extended or adjusted under 35 U.S.C. 154(b) by 0 days.

(21) Appl. No.: 09/298,120

(22) Filed: Apr. 23, 1999

(51) Int. Cl.$^7$ .......................... G08B 29/00; G06F 15/00
(52) U.S. Cl. ...................... 702/184; 702/182; 702/188; 340/505; 340/511
(58) Field of Search .................. 702/57–58, 81–82, 702/182–193, 500; 399/8, 9; 340/500, 505, 511

(56) References Cited

U.S. PATENT DOCUMENTS

| | | | |
|---|---|---|---|
| 4,512,442 A | 4/1985 | Moore et al. .............. 187/29 R |
| 5,175,503 A | * 12/1992 | Mishra et al. .............. 324/452 |
| 5,225,873 A | * 7/1993 | Lux et al. ...................... 399/8 |
| 5,363,316 A | 11/1994 | Spencer ...................... 364/550 |
| 5,445,347 A | 8/1995 | Ng ........................... 246/169 R |
| 5,548,374 A | * 8/1996 | Iguchi et al. ................. 399/24 |
| 5,570,300 A | 10/1996 | Henry et al. ................ 364/550 |
| 5,571,007 A | 11/1996 | Ishiguro et al. .............. 431/13 |
| 5,719,675 A | 2/1998 | Killpatrick et al. ......... 356/350 |
| 5,764,073 A | 6/1998 | Sadamatsu .................. 324/765 |
| 5,768,119 A | 6/1998 | Havekost et al. ............ 364/133 |
| 5,774,378 A | 6/1998 | Yang ...................... 364/571.02 |
| 5,774,425 A | 6/1998 | Ivanov et al. .................. 368/11 |
| 5,822,717 A | * 10/1998 | Tsiang et al. ................ 702/108 |
| 5,867,809 A | * 2/1999 | Soga et al. .................. 702/130 |
| 5,926,777 A | * 7/1999 | Vink et al. ................... 702/182 |

FOREIGN PATENT DOCUMENTS

JP   63 238515   10/1988

OTHER PUBLICATIONS

International Search Report.
M.P. Henry and D.W. Clarke, "The Self–Validating Sensor: Rationale, Definitions and Examples," Control Eng. Practice, (1993) 1.4:585–610.

* cited by examiner

*Primary Examiner*—Bryan Bui
(74) *Attorney, Agent, or Firm*—Kevin A. Oliver; W. Hugo Liepmann; Foley Hoag & Eliot llp

(57) ABSTRACT

A lifetime-prediction system generates an estimate of the remaining lifetime of a system component on the basis of the amount of time and the extent to which a measured-variable signal generated by the system component exceeds a stress threshold. The accumulation of measured-variable signals and the estimation of the remaining lifetime are performed locally to the system component, thereby reducing data traffic between the system component and a centralized processor and ensuring portability of the system component.

33 Claims, 7 Drawing Sheets

DISTRIBUTED PROCESSING SYSTEM FOR COMPONENT LIFETIME PREDICTION

This invention relates to the field of scheduled system maintenance and, in particular, to a distributed processing system for the prediction of remaining lifetimes of system components

BACKGROUND

Routine maintenance of a system, whether it be a mechanical, electromechanical or chemical system, typically includes the periodic replacement of worn system components. A problem in routine maintenance of such a system is scheduling the optimal replacement time of each component. If maintenance personnel replace a component prematurely, the remaining lifetime of that component is wasted. On the other hand, if maintenance personnel wait to replace a component until after it has failed, the consequences may be catastrophic.

Because the consequence of waiting for failure to occur before replacing a component can be so severe, and because accurate prediction of component lifetime is difficult, maintenance schedulers typically err on the side of premature replacement. This conservative policy increases costs, both because premature replacement results in discarding the remaining lifetime of the replaced component and because premature replacement may result in frequent system shutdowns for each replacement operation.

A significant cause of the difficulties inherent in estimating the useful lifetime of a component is that random disturbances unpredictably shorten the component's lifetime. For example, one may know the probability that a reactor vessel will fail after repeated exposure to an excessive pressure integrated over an excessive time. However, in the absence of a way to quantitatively integrate the exposure of that vessel to excess pressure, this knowledge is of limited practical value.

In the foregoing example, even if one could monitor a quantity representative of the wear experienced by that component, one would still have to predict the component lifetime on the basis of the values of that quantity. This typically includes the step of transmitting a considerable amount of data from the component to a centralized processor located remotely from the component. This centralized processor is typically also monitoring other indicia of wear associated with other components of the system in an effort to predict remaining lifetimes for those other components, all of which are likewise transmitting considerable amounts of data to the processor. For the sake of economy, this data generally travels on a communication channel shared by all system components. The resulting heavy data traffic generated by data transfer between the various system components and a centralized processor over this shared communication channel interferes with communication between that processor and those system components, thereby militating against the use of shared communication channels. As a result, a dedicated data transmission channel is often provided between each component and the central processor.

Such a dedicated data transmission channel for each component adds cost and leads to inefficiency in the utilization of resources. For example, a first channel between the central processor and a reactant vessel may be exceptionally busy while a second channel between the central processor and a pump may stand idle because of an absence of data traffic between the central processor and the pump. Since these two channels are separate and dedicated to their respective functions, it is not possible to utilize the excess capacity of the second channel to communicate data between the central processor and the reactor vessel.

An additional disadvantage of a lifetime-prediction system as described above is the risk associated with reliance on a centralized processor and data storage facility for storage and processing of data for a multiplicity of components. In such a system, a failure in the central storage facility potentially results in loss of all historical data for all components of the system. Similarly, a failure in the centralized processor can potentially cripple the system by making it virtually impossible to schedule maintenance for all system components.

The disadvantage of reliance on a centralized processor and data storage facility extends beyond the possibility of data loss resulting from equipment failure. For example, if a system component in a first chemical processing plant fails, it may be necessary to replace it with a similar component from a currently idle second processing plant. That second processing plant may be at a remote location and under the control of a different centralized processor having a different data storage facility. As a result, the history of that replacement component may not be readily available to maintenance personnel at the first processing plant.

Similarly, if a component is returned to the manufacturer for routine service, the history of that component may not be readily available to the manufacturer. This will, in turn, hinder the manufacturer's efforts at servicing the component. As a result, the manufacturer may erroneously perform unneeded service and neglect to perform necessary maintenance tasks.

It is apparent that even a modest number of components can impose an intolerable processing burden on the centralized processor and shared data-communication network of the prior art system described above. In such a system, the centralized processor receives data from many components, all of which are likely to transmit asynchronously. The centralized processor must then process the data to predict the remaining lifetime of each component. If the centralized processor is busy predicting the remaining lifetime of one component, it must find a buffer for temporary storage of the data arriving from another component. At the very least, this results in delays because a large number of components are competing for the limited computational resources of the centralized processor. In some cases, because of the complexity of the software required to manage the competing components, the system may be subject to sporadic failures caused by software bugs. Moreover, an increase in the number of components whose lifetimes are to be predicted further exacerbates these problems.

It is known in the art to perform rudimentary data processing local to a measurement sensor. For example, upon request by an interrogating agent, a dedicated microprocessor located at a sensor may average several instantaneous sensor measurements and transmit an average measurement to a centralized processor. However, in such systems, the locally performed processing steps are not under the control of the interrogating agent. Thus, an interrogating agent that needs a short term average taken over ten measured values may not receive an appropriate response from a dedicated microprocessor pre-programmed to return a long term average over one hundred measured values. In effect, the dedicated microprocessor gathers a set of data, performs the specified calculation, and discards the data, even though additional processing of the same data may yield valuable information in the future, either to the same interrogating agent or to a different interrogating agent.

It is often the case that different interrogating agents may desire different calculations using the same data. For example, in the case of a reactor vessel in which a sensor measures temperature, one interrogating agent may require the amount of time that the temperature is in excess of a particular threshold temperature after initiation of a chemical reaction in order to determine whether the reactants have been consumed. A different interrogating agent may require the number of times since the reactor vessel was last replaced that the temperature has exceeded a second threshold in order to evaluate the continued integrity of the reactor vessel. In both cases, the interrogating agents require access to the same data, but for different calculations.

It is therefore desirable in the art to reduce data traffic between a plurality of components being monitored and the centralized processor monitoring those components and to make that data available for processing by a lifetime-prediction algorithm selected in response to the type of interrogating agent requesting information concerning the system component.

It is also desirable in the art to provide a system in which the computational burden on a single centralized processor remains relatively stable even as the number of components increases.

SUMMARY

In a lifetime-prediction system according to the invention, a system component whose remaining lifetime is to be estimated generates a time-varying physical parameter the value of which is indicative of the wear or stress inflicted on that system component. A measuring element then monitors this parameter, by way of a local link or communication channel, and generates a corresponding measured-variable signal.

In response to a request from a remote interrogating agent, the measuring element provides the measured-variable signal to a processor local to the system component, again by means of a local communication channel. This processor predicts, on the basis of the measured-variable signal, the remaining lifetime of the system component. The processor then generates an output signal containing information about the remaining lifetime of the system component and transmits that output signal, through a network interface, to the remote interrogating agent.

Because the monitoring of the measured-variable signal and the estimation of the remaining lifetime are both local to the system component, a system according to the invention reduces data traffic on a network linking several system components to a centralized processor. An additional advantage of the decentralized processing system of the invention is the increased portability of the system component. In a lifetime-prediction system according to the invention, one can remove and replace system components without the need to change maintenance records at a centralized processor because the maintenance data associated with a system component travels with that component.

In a preferred embodiment, the processor generates a remaining lifetime estimate on the basis of the extent to which the measured-variable signal is in excess of a stress threshold. The processor does so by generating a cumulative stress in which each term of a summation corresponds to the extent to which the measured-variable signal exceeds the stress threshold and in which each such term is weighted by the amount of time during which the measured-variable signal exceeds the threshold. Depending on the specific application, the summation can be a sum of linear terms in this extent or, the sum of nth order terms in the extent, or a sum of nth order polynomials in the extent.

The processor, in the preferred embodiment, evaluates a stress rate by dividing the cumulative stress, as evaluated above, by the amount of time during which the measured-variable signal exceeds the stress threshold. The difference between the cumulative stress and a maximum allowable accumulated stress value, when divided by this stress rate, provides an estimate of the remaining lifetime for the system component.

The stress threshold and the maximum allowable stress value in the preferred embodiment are programmable. They can thus be altered by the remote interrogating agent. As a result, a system according to the preferred embodiment of the invention has the capability of using the same data to provide different estimates of the remaining lifetime depending on the purpose of the estimate. Both the stress thresholds and maximum allowable stress values are preferably stored in non-volatile registers to ensure that they are preserved in the event of a power interruption. The ability to re-use the same data for different purposes provides a significant savings in storage requirements for a system embodying the invention.

A system embodying the invention optionally includes an internal clock and access to an external time standard. This optional feature allows the system to resynchronize its internal clock and to compensate for such anomalies as power interruptions, drift in the internal clock, sampling intervals of incorrect duration, and sampling events that occur at incorrect times.

BRIEF DESCRIPTION OF THE FIGURES

The foregoing and other objects, features and advantages of the invention will be apparent from the following description and apparent from the accompanying drawings, in which.

DETAILED DESCRIPTION

Figure 1:
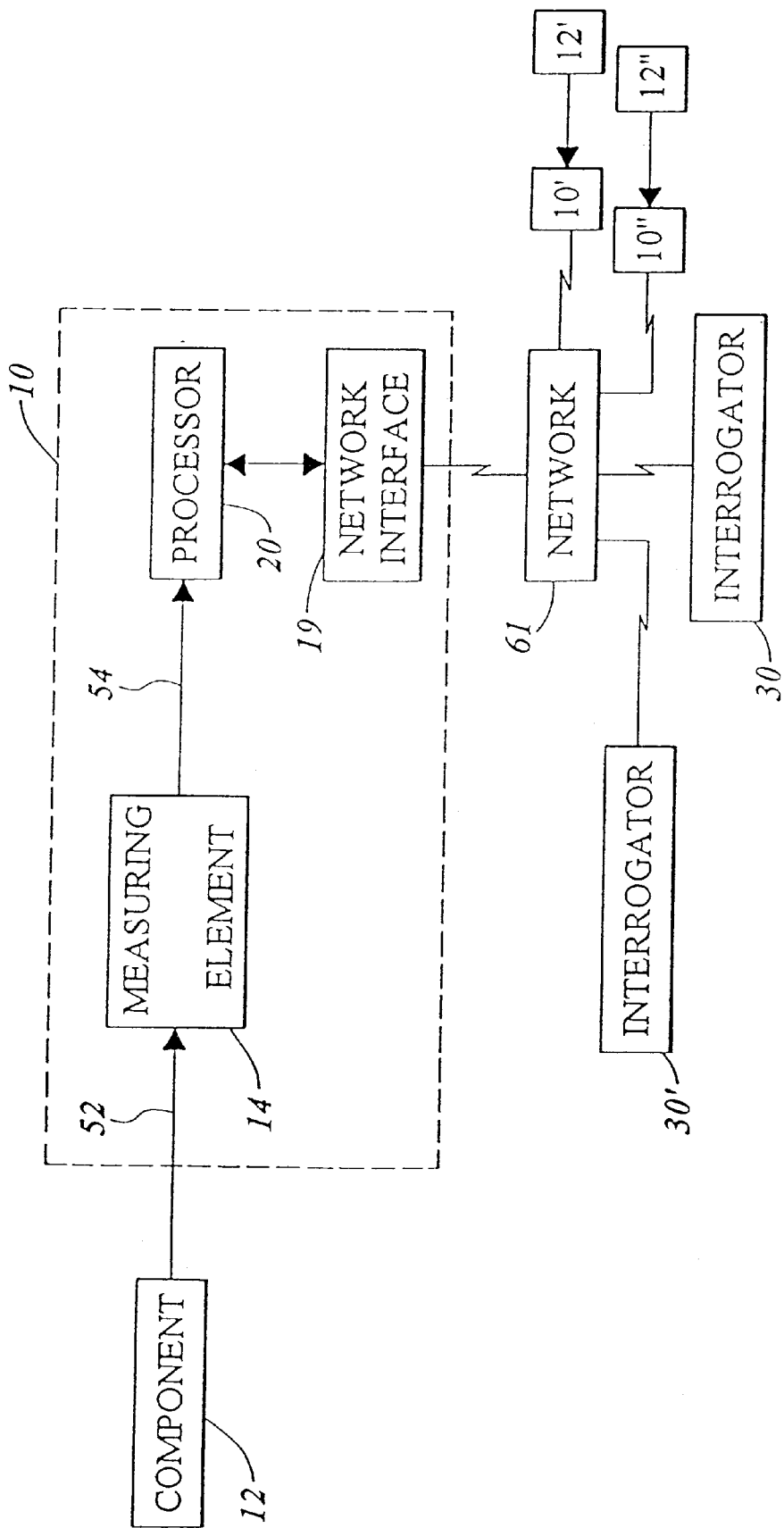
FIG. 1 shows a component lifetime predictor according to the invention connected to a network shared by other component lifetime predictors.

Referring to FIG. 1, a lifetime-prediction system 10 for predicting the remaining lifetime of a system component 12 in accord with one practice of the invention includes a measuring element 14 responsive to the state of the system component 12 and adapted for measuring the value of a measured variable based on the state of that system component 12 via an appropriate dedicated link 52 such as a pressure carrying tube, a heat transfer path (either radiant, conductive, or convective), or any other method for transmitting a physical parameter. The value of that measured variable is used to estimate the wear experienced by the system component 12. For example, if the system component 12 is a pressure vessel and the measuring element 14 is a pressure gauge connected to the vessel by a pressure carrying tube, the measured variable can be the pressure measured by the gauge, or the rate of change of pressure with respect to time, or some other quantity, whether derived or measured, that is indicative of the wear inflicted on that system component 12. Alternatively, the pressure gauge itself can be identified as the system component 12 and the measuring element 14 can be internal to the pressure gauge. In such a case, one can monitor the wear inflicted on the pressure gauge by periods of excessively high pressure.

The measuring element 14 is local to the system component 12, so that the connection between the measuring element 14 and the system component 12 is established by way of the dedicated link 52 between the measuring element 14 and the system component 12 and without the use of a shared data-communication network 61 shared by other system components 12', 12". Depending on the measured variable and the type of system component 12, the measuring element 14 can optionally include a conventional signal processing subsystem for preliminary processing tasks such as noise elimination and jitter reduction.

The measuring element 14 is in communication with a local processor 20 adapted to receive a time series of values of the measurement element output and to estimate, on the basis of that time-series, the remaining lifetime of the system component 12. The local processor 20, like the measuring element 14, is local to the system component 12. Consequently, communication between the local processor 20 and the measuring element 14 is likewise accomplished over a local link 54, such as dedicated wires, a local backplane bus, or a shared computer bus, and without the throughput constraints of the shared data-communication network 61.

A network interface 19, provides communication over the shared data-communication network 61 connecting the local processor 20 and one or more interrogating agents 30, 30' located remotely from the lifetime-prediction system 10. Each such interrogating agent 30, 30' can be connected to several lifetime-prediction system 10', 10", each of which has an associated system component 12', 12". The shared data-communication network 61 implements standard internet protocol, ethernet protocol, or any of a variety of protocols for allowing remote communication between one or more interrogating agents 30, 30' and a multiplicity of lifetime-prediction systems 10, 10', 10".

The interrogating agent 30 is a central computing facility running software for scheduling maintenance or replacement of system components and for alerting maintenance personnel of the need for such maintenance. Alternatively, the interrogating agent 30 is an interactive computer that transmits instructions to the local processor 20 in response to user inputs.

In operation, the measuring element 14 generates values of the measured variable derived from its connection to the system component 12 and provides those values to the local processor 20. Because the dedicated links 52, 54 between the system component 12, the measuring element 14, and the local processor 20 are separate from the shared data-communication network 61, data transfer between the system component 12 and the measuring element 14 does not generate additional data traffic on the shared data-communication network 61. Additionally, the measurement process proceeds autonomously under the control of the measuring element 14 and therefore does not require intervention from a centralized processor.

Figure 2:
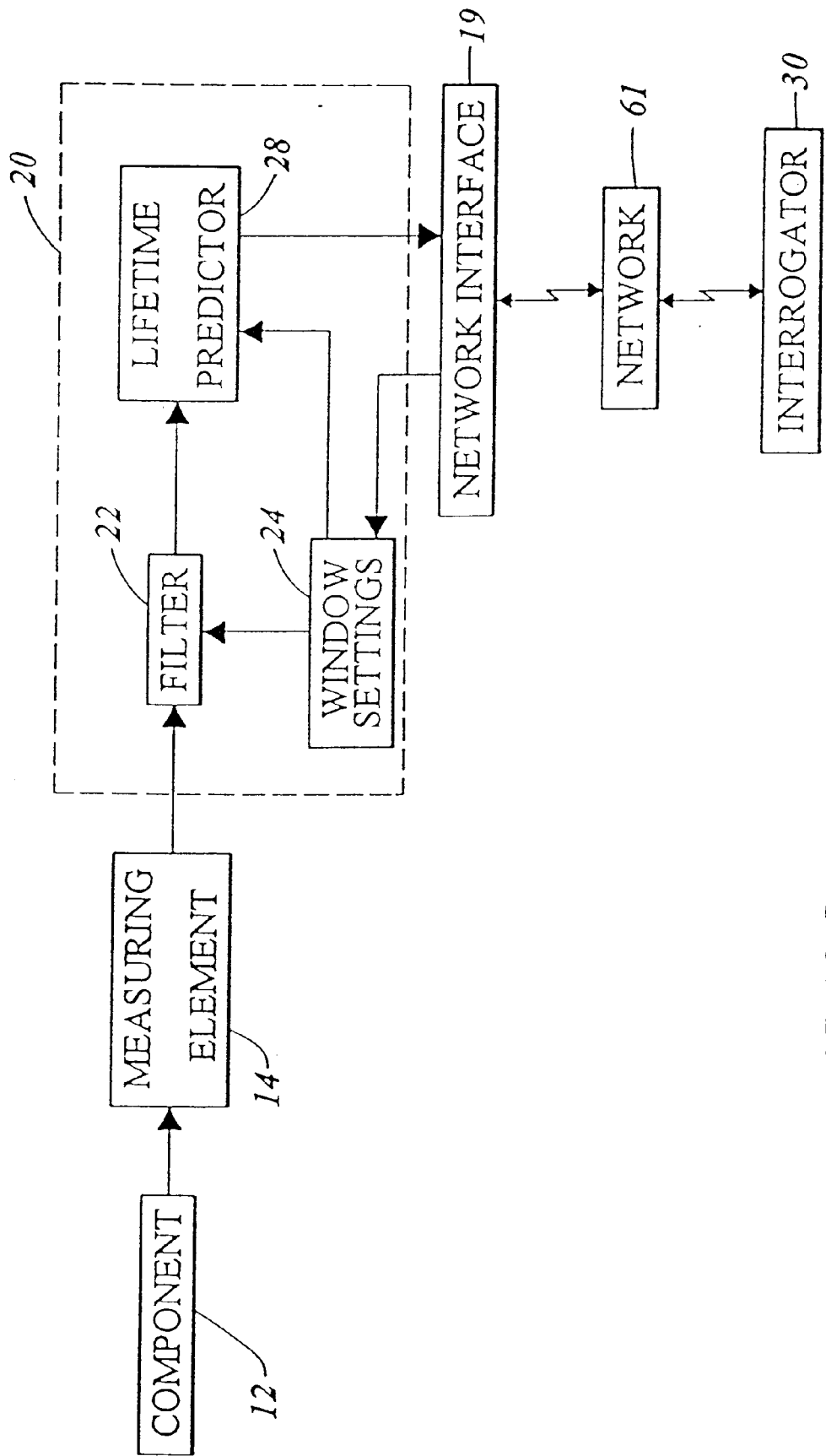
FIG. 2 shows the architecture of the processor section of the component lifetime predictor of FIG. 1.

One illustrated logic architecture of the local processor 20, shown in FIG. 2, includes a windowing filter 22 having a temporal window whose temporal extent is under the control of a window-settings register 24. Preferably, the window-settings register 24 is non-volatile, so that in the event of a power interruption, any data stored in that register will be available after power is restored. The windowing filter 22 generates filtered data and makes that filtered data available to a lifetime predictor 28.

The interrogating agent 30 transmits instructions to the network interface 19 over the shared data-communication network 61. These instructions, which govern the manner in which the local processor 20 estimates the remaining lifetime of the system component 12, include specifications for the type of window and specifications for the type of lifetime-prediction algorithm. The instructions optionally include specifications for any alarms to be generated by the local processor 20 and transmitted to the interrogating agent 30 through the hared data communication network 61. The specific nature of these instructions depends on the purpose of the interrogation request and on the nature of the system component 12. For example, for some system components, particularly those whose proper operation impacts safety, it may be preferable for the interrogating agent 30 to request a more conservative estimate for the remaining lifetime. The local processor 20 accommodates a variety of such interrogation requests in a manner to be described below.

The network interface 19 provides the instructions to both the window-settings register 24 and to the lifetime predictor 28. The lifetime predictor 28, in response to these instructions, retrieves the appropriate data from the window, makes the specified prediction, and transmits an output signal to the network interface 19 for transmission across the shared data-communication network 61 to the interrogating agent 30. The output signal includes either an estimate of the remaining lifetime of the system component 12, an alarm flag for cases in which the remaining lifetime falls below a user-defined alarm threshold, or both.

Figure 4A:
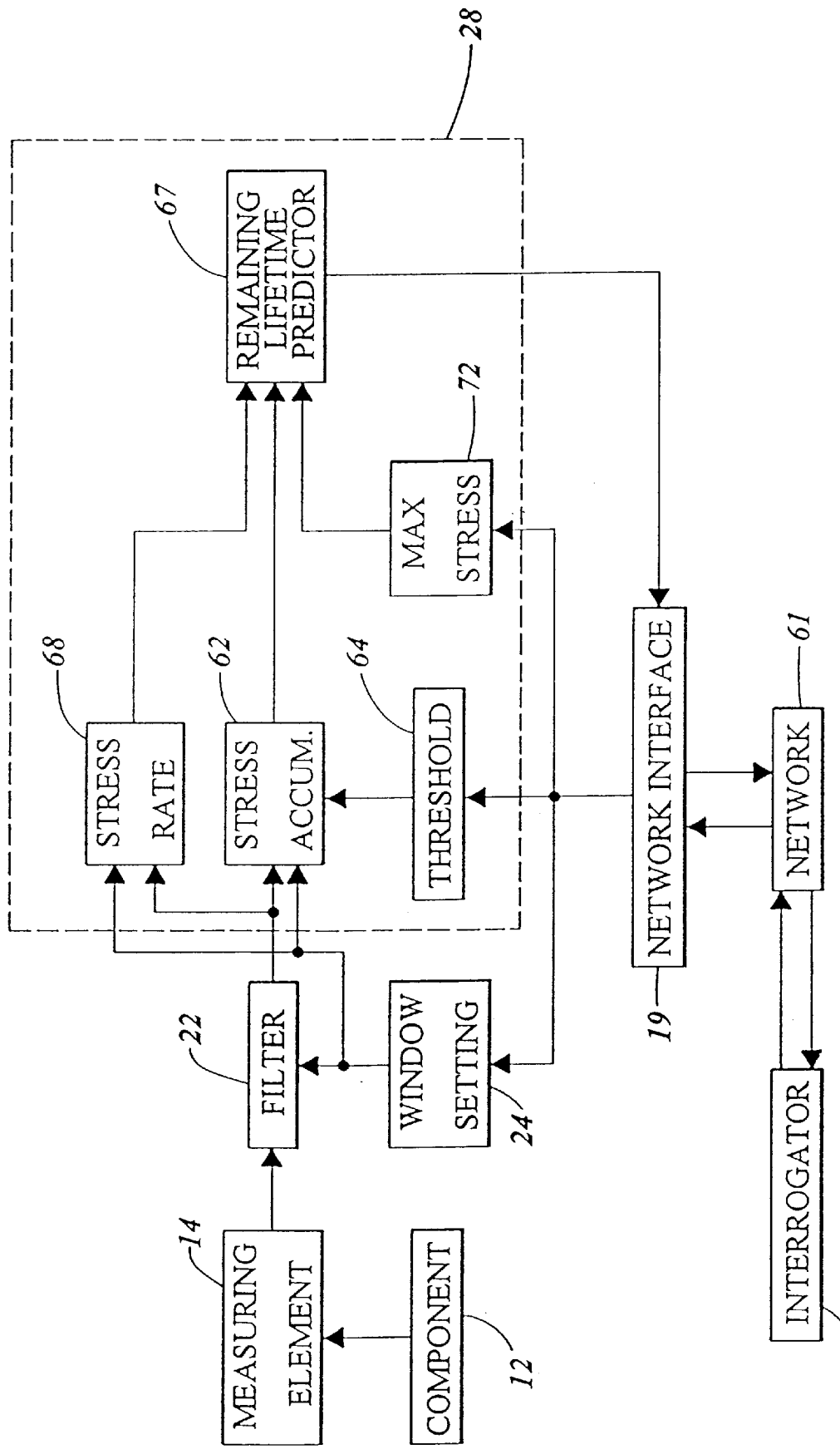
FIG. 4A shows the architecture of the lifetime predictor of FIG. 2.

As shown in FIG. 4A, one lifetime predictor 28 for practice of the invention includes a stress accumulator 62 for integrating the stress experienced by the system component 12 over an interval specified by instructions transmitted by the interrogating agent 30 to the window-settings register 24. Preferably, the stress accumulator 62 is non-volatile, so that in the event of a power interruption, any data stored in the stress accumulator 62 will be available after power is restored. The stress experienced by the system component 12 is defined, in the preferred embodiment, as a function of the measured values vi obtained by the measuring element 14 and a stress threshold $\tau$ stored in a stress-threshold register 64. This stress threshold $\tau$ can be predefined, or it can be stored in the stress-threshold register 64 in response to instructions from the interrogating agent 30. Preferably, the stress-threshold register 64 is non-volatile, so that in the event of a power interruption, any data stored in that register will be available after power is restored. In the preferred embodiment, the accumulated stress is given by summing, for those values in excess of a stress threshold, the differences between each value of the measured variable $v_i$ in the window, as specified by the window-settings register 24, and the stress threshold $\tau$, as stored in the stress-threshold register 64. In other words:

$$\text{accum\_stess} = \sum_{i=1}^{N} (v_i - \tau) u(v_i - \tau) \quad (1)$$

where N corresponds to the number of samples in the window, $\tau$ is the stress threshold stored in the stress-threshold register 64, and $u(x)$ is the unit step function, defined throughout this specification as:

$$u(x) = \begin{cases} 1 & \text{for } x \geq 0 \\ 0 & \text{for } x < 0 \end{cases} \quad (2)$$

Figure 5:
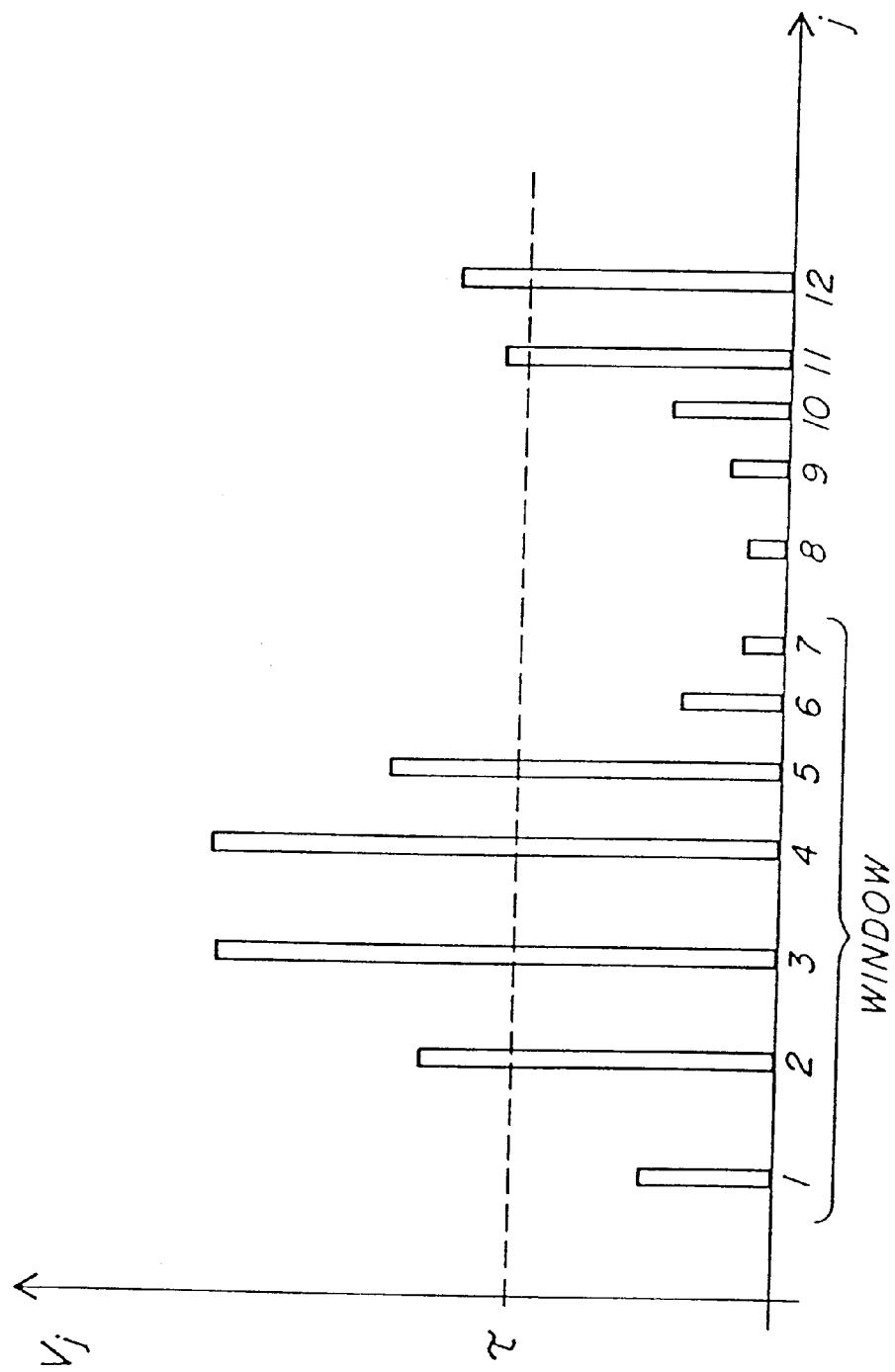
FIG. 5 shows representative values of a measurement variable obtained from the component by the measuring element of FIG. 2.

A graphical illustration of a particular summation of this type is shown in FIG. 5.

Alternatively, the accumulated stress can be given by summing, for those values in excess of a stress threshold, the measured values themselves, as in:

$$\text{accum\_stress} = \sum_{i=1}^{N} v_i u(v_i - \tau) \quad (3)$$

Moreover, the accumulated stress need not be a sum of linear terms. For example, the accumulated stress can be defined as $$\text{accum\_stress} = \sum_{i=1}^{N} a_i (v_i - \tau_i)^n u(v_i - \tau_i) \quad (4)$$

where n is a real number. Note that equation (1) is a special case of equation (4) with n=1 and each $a_i$=1. This corresponds to a linear stress model (because n=1) with samples at equal intervals. Note that n need not be an integer. For example, if the square root of the difference is sought, n can be set to ½. The weighting coefficient $a_i$ is a measure of the exposure time, or the time that the measured variable is in excess of the threshold. Variations in $a_i$ from one sample to the next accommodate cases in which the intervals represented by each sample are non-uniform. This is analogous to numerical integration with an uneven step size $\Delta x_i$ in which the weighting coefficient $a_i$ corresponds to a step size $\Delta x_i$ along the axis of the integration variable.

Figure 6:
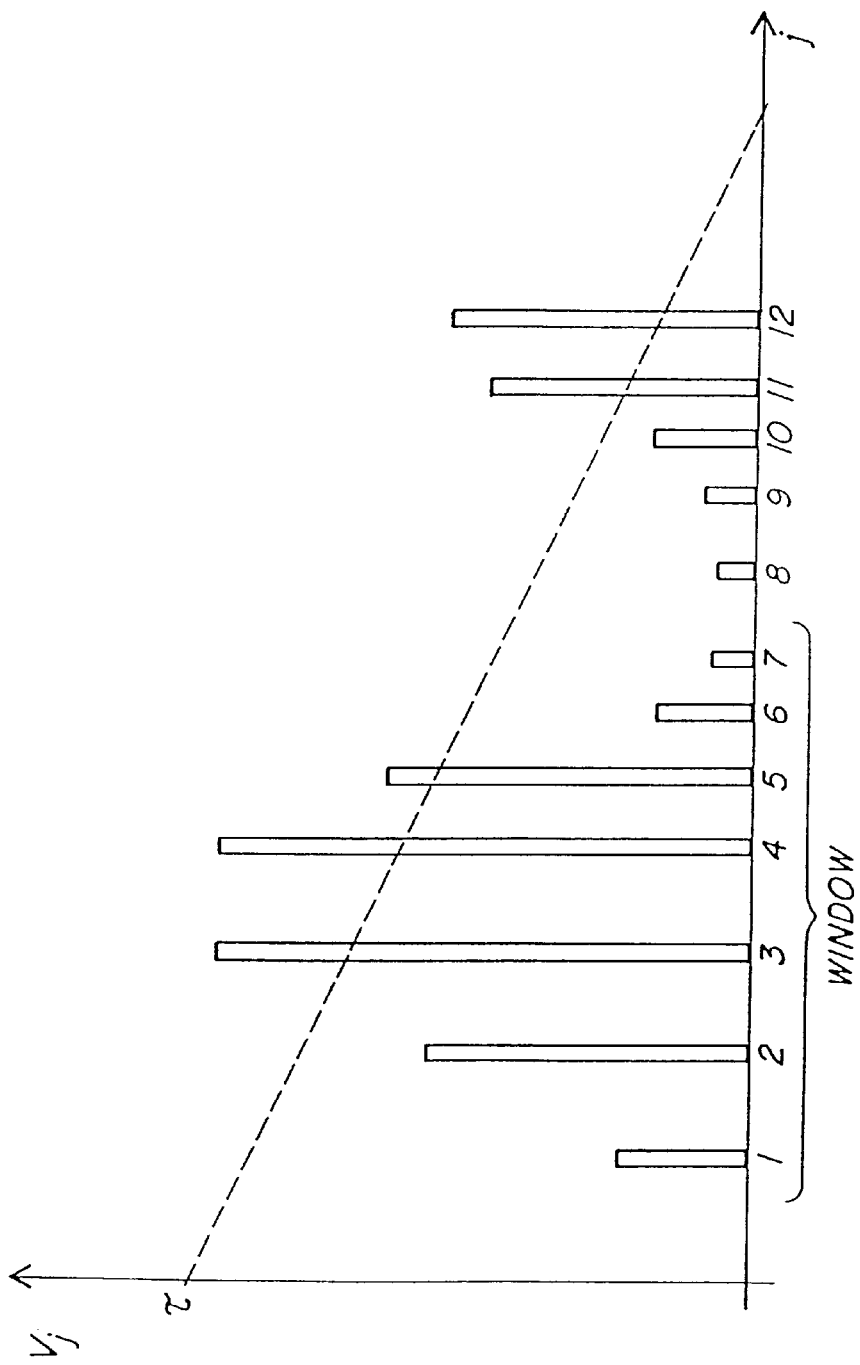
FIG. 6 shows the representative values of the measurement variable in FIG. 5 but with a threshold that varies with time.

A further generalization indicated in equation (4) is that the stress threshold $\tau_i$ can vary with the sample i. For example, in a stress model that includes a healing process, an older stress event requires a higher threshold to influence lifetime prediction. In such a case, it may be appropriate for $\tau_i > \tau_j$ when i <j as shown in FIG. 6.

Both the measured values $v_i$ generated by the windowing filter 22 and the window settings from the window-settings register 24 are used by a stress-rate evaluation module 68 to evaluate a stress rate. Preferably, the stress-rate evaluation module 68 is non-volatile, so that in the event of a power interruption, any data stored therein will be available after power is restored. In the preferred embodiment, the stress rate is the accumulated stress associated with the N most recent values of the measured variable divided by the accumulated time during which the measured variable exceeds a measured variable threshold. This can be represented by:

$$\text{stress\_rate} = \frac{\sum_{i=1}^{N} (v_i - \tau)^n u(v_i - \tau)}{\sum_{i=1}^{N} u(v_i - \tau)} \quad (5)$$

where N and n are the same numbers used in equation (4) and each sample represents the same interval.

Since the stress rate is derived from the amount of time the measured-variable signal exceeds a stress threshold, it is preferable that the samples $v_i$ be equally spaced in time. In the event that these samples are not spaced at equal intervals, for example as a result of power outages, missing samples, or fluctuations in the sampling rate, it is desireable to provide a procedure for synchronizing the samples generated by the measuring element with an absolute time. The implementation of such a synchronization procedure for evaluating the temporal interval between two samples can be accomplished in a variety of ways by one of skill in the art. For example, the local processor 20 can periodically request a time-check over the shared data-communication network 61 and use the result of that time check to record, in non-volatile memory, any offset between absolute time and processor time. On the basis of these offset values, the processor 20 corrects for drift in the processor time, detects power outages, provides an estimate of the accumulated lost time, and corrects for the undesirable effect of missing samples or unequal sampling intervals on the predicted lifetime of the system component 12.

Referring again to FIG. 4A, the accumulated stress generated by the stress accumulator 62 and the stress rate generated by the stress-rate evaluation module 68 are then passed to a remaining-lifetime predictor 67 for comparison with a maximum allowable accumulated stress value smax stored in a maximum-stress register 72. Preferably, the maximum stress register 72 is non-volatile, so that in the event of a power interruption, any data stored in that register will be available after power is restored. The maximum allowable accumulated stress value can be predefined, or it can be stored in the maximum-stress register 72 in response to instructions from the interrogating agent 30.

The remaining-lifetime predictor 67 then estimates the remaining lifetime of the system component 12 either as a function of the accumulated stress, the maximum allowable accumulated stress value and the stress-rate, or as an empirical look-up table. The exact form of the function to be evaluated or the entries in the look-up table will depend on the specific nature of the component and the needs of the interrogating agent. The result of evaluating that function or performing a table look-up is the estimate of the remaining lifetime that the local processor 20 ultimately provides to the interrogating agent 30.

In the preferred embodiment, the remaining-lifetime predictor 67 estimates the remaining lifetime by obtaining the difference between the maximum allowable accumulated stress, as stored in the maximum-stress register 72, and the accumulated stress, as evaluated by the stress accumulator 62. The remaining-lifetime predictor 67 then divides that difference by the stress rate, as evaluated by the stress-rate evaluation module 68. Note that the numerator in the foregoing ratio has dimensions of stress and that the denominator has dimensions of stress per unit time. As a result, the ratio itself has dimensions of time, which is dimensionally consistent with a predicted lifetime. If an accumulated stress is given by a sum of nth order terms, as in equation (4), then the dimensions of the maximum allowable accumulated stress and the stress-rate must be adjusted accordingly, in a manner clear to one of skill in the art, in order for the remaining-lifetime prediction to have units of time.

The resulting estimate of the remaining lifetime is then encoded into an output signal and transmitted to the interrogating agent 30 by means of the network interface 19. The output signal can include the numerical value of the remaining lifetime. Alternatively, the output signal can be an alarm signal indicating whether the remaining lifetime estimate has fallen below one or more pre-defined alarm thresholds.

FIG. 5 shows a typical time series of measured values $v_i$. The window-settings register 24 defines a time-varying window over which the stress accumulator 62 sums this time series of measured values. In this example, the window defined by the window-settings register 24 includes samples 2 through 7. The illustrated time series contains twelve values, of which six are contained within the exemplary window defined by the window-settings register 24. Of these six values, four exceed the stress threshold τ stored in the window-settings register 24. It is these four values that contribute to the summation in equation (1). The window-settings register 24 implements two types of windows: an anchored window of variable extent 80, shown in FIG. 3A, and a moving window of fixed extent 85, shown in FIG. 3B.

Figures 3A, 3B:
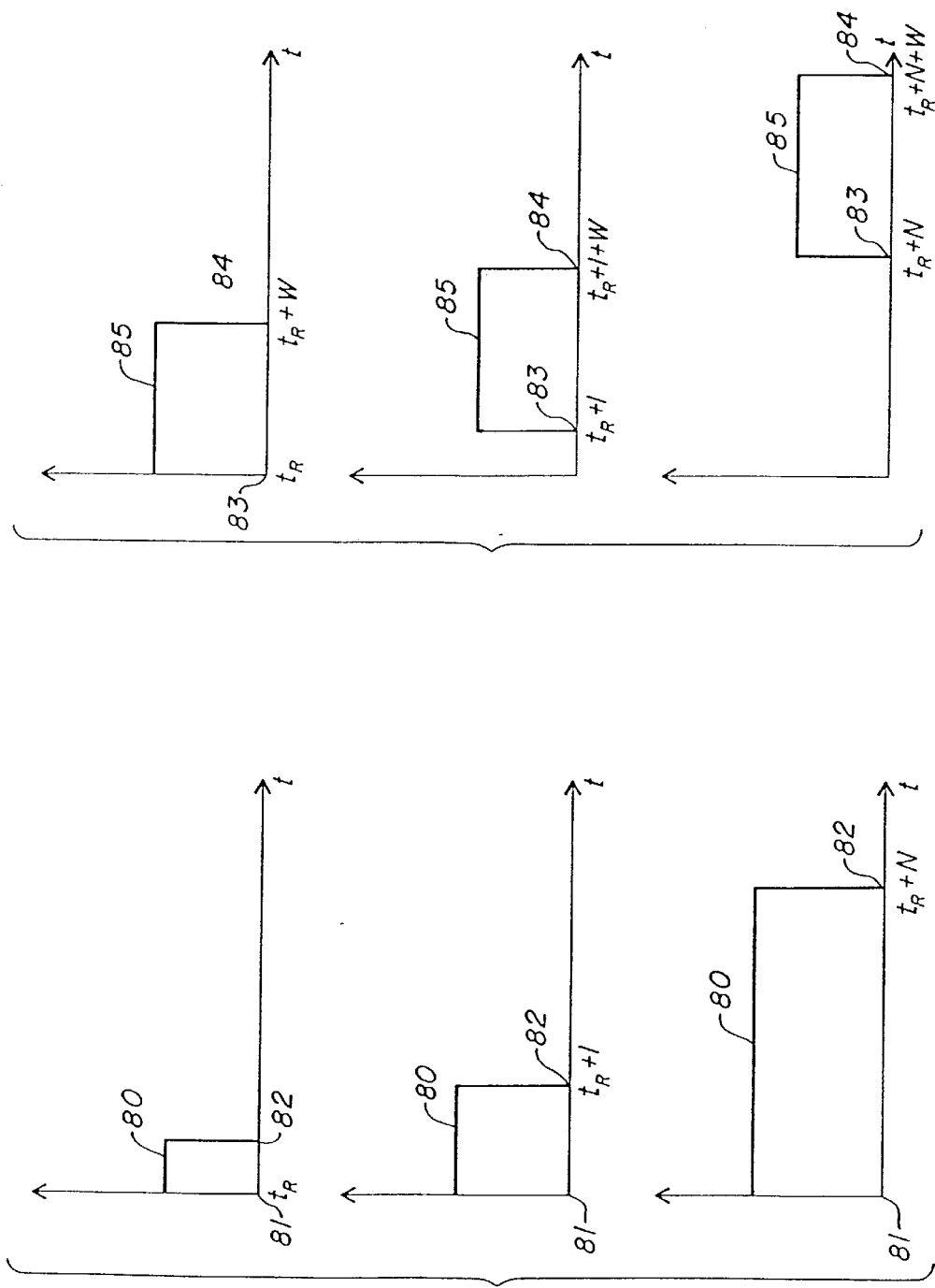
FIG. 3A shows an anchored window of variable extent generated by the filter of FIG. 2 in response to instructions from the window-settings register of FIG. 2.
FIG. 3B shows a moving window of fixed extent generated by the filter of FIG. 2 in response to instructions from the window-settings register of FIG. 2.

Referring to FIG. 3A, the anchored window of variable extent 80 has two endpoints: an anchored endpoint 81 and a variable endpoint 82. As the measuring element 14 acquires each new sample of the measured variable, the windowing filter 22 adjusts the variable endpoint 82 to accommodate the new sample, as shown by the three graphs in FIG. 3A.

The moving window of fixed extent 85 has two endpoints: a first endpoint 83, and a second endpoint 84 displaced from the first endpoint 83 by a constant value W. Together, the first and second endpoints define an interval of fixed extent, W. As the measuring element 14 acquires each new sample of the measured variable, the windowing filter 22 adjusts the second endpoint 84 to accommodate the new sample and adjusts the first endpoint 83 to maintain the same interval W between the first and second endpoints, as shown by the three graphs in FIG. 3B. Alternatively, the first and second endpoints can define an interval having a fixed number of samples. In this case, as each new sample is obtained, the oldest sample is discarded in order to maintain the same number of samples in the window.

The anchored window of variable extent 80 is typically used to generate an accumulated stress value, or a stress rate, that takes into account the entire history of the component. In contrast, the moving window of fixed extent in typically used to generate stress rate estimates on the basis of only the most recent stress values. A lifetime predictor can use either or both types of window depending on the interrogating agent's 30 request.

The windows 80, 85 shown in FIGS. 3A and 3B are illustrated as being of constant amplitude. As a result, when a sample exceeds the stress threshold, the contribution made to the accumulated stress is the same regardless of where in the window the sample occurs. However, the window-settings register 24 can specify other types of windows. For example, an anchored window of variable extent can provide greater weight to more recent excursions above the stress threshold by having an amplitude that increases from a minimum at the anchored endpoint to a maximum at the variable endpoint. Viewed in this way, the moving window of fixed extent 85 shown in FIG. 3B can be thought of as a special case of the anchored window of variable extent 80 shown in FIG. 3A in which the function defining the amplitude of the window, W(n), is given by $$W(n) = u(t_r + n) - u(t_r + n + w) \qquad (6)$$

where u(n) is the unit step function as defined in equation (2) and w is the desired extent of the window.

The manner in which the stress accumulator 62 of the preferred embodiment (see FIG. 4A) generates the accumulated stress is illustrated in FIG. 5 for the case of a moving window of fixed extent. The stress accumulator 62 obtains the stress threshold value (τ) from the stress-threshold register 64 and obtains filtered data values ($v_2, v_3 \ldots v_7$) from the windowing filter 22. The stress accumulator 62 then evaluates the difference between each filtered data value $v_j$ and the stress threshold value, τ. These differences are then used to evaluate the following sum:

$$\text{acc\_stress} = \sum_{j=2}^{7} (v_j - \tau)^n u(v_j - \tau) \qquad (7)$$

where n is an exponent specified by the interrogating agent 30 as part of the instructions transmitted to the local processor 20. Note that n need not be integer. For example, where the square root of the difference is sought, n can be set equal to ½.

In certain limiting cases, it is desirable to provide default values for stress-rate or additional algorithms for evaluation of the stress-rate. For example, if a high stress threshold has been specified and no recent values of the measured variable have exceeded the threshold, then the stress rate defined in equation (5) will be zero. If this zero stress-rate divides the accumulated stress, as described above in connection with the computation of the remaining lifetime estimate in the preferred embodiment, the resulting remaining lifetime estimate will be infinite. Similarly, if the system has recently started up, it may be that there are still an insufficient number of sampled values of the measured variable signal to sum over the duration of a window.

Under these circumstances, the stress-rate evaluation module 68 can include default values or additional algorithms for providing a reasonable stress-rate value for use by the lifetime-predictor 28. For example, the stress-rate can be computed on the basis of the largest stress values occurring in a designated interval.

It is apparent that the foregoing system estimates the remaining component lifetime on the basis of summations involving the measured variables $v_i$ and not directly on those measured variables. Accordingly, it is not necessary in such a system to provide storage for all values of the measured variables generated during the operation of a component. For example, in the case of an anchored window of variable extent, computation of a new value for the accumulated stress can be performed by adding a term corresponding to the current stress value to the previous value for the accumulated stress. Conversely, in the case of a variable window of fixed extent, one can evaluate the accumulated stress by summing a limited number of values of the measured variable. The fact that the component-lifetime prediction depends on a quantity derived from the measured values, and that this quantity is readily updated as additional values are obtained reduces the requirements for storage of measured values. In this way, a system according to the invention provides significant savings in data storage requirements.

As shown in FIG. 1, a plurality of interrogating agents 30, 30' is connected to the lifetime-prediction system 10 through the shared data-communication network 61. Each of these interrogating agents solicits an estimate of the component's remaining lifetime. However, as indicated above, some interrogating agents may require more conservative estimates of the remaining lifetime than others. Consequently, it is desirable to use different stress thresholds or different maximum stress values depending on the particular interrogating agent making the request.

In the case of a fixed window of variable extent, as shown in FIG. 3A, it is quite clear that the stress accumulator 62 cannot readily recalculate the summation $$\text{accum\_stress} = \sum_{i=1}^{N} (v_i - \tau)^n u(v_i - \tau) \quad (8)$$

for different stress-threshold values, $\tau$, without having access to all N values of $v_i$. Unfortunately, it is impractical to provide such access since N has the potential to increase without limit.

Figure 4B:
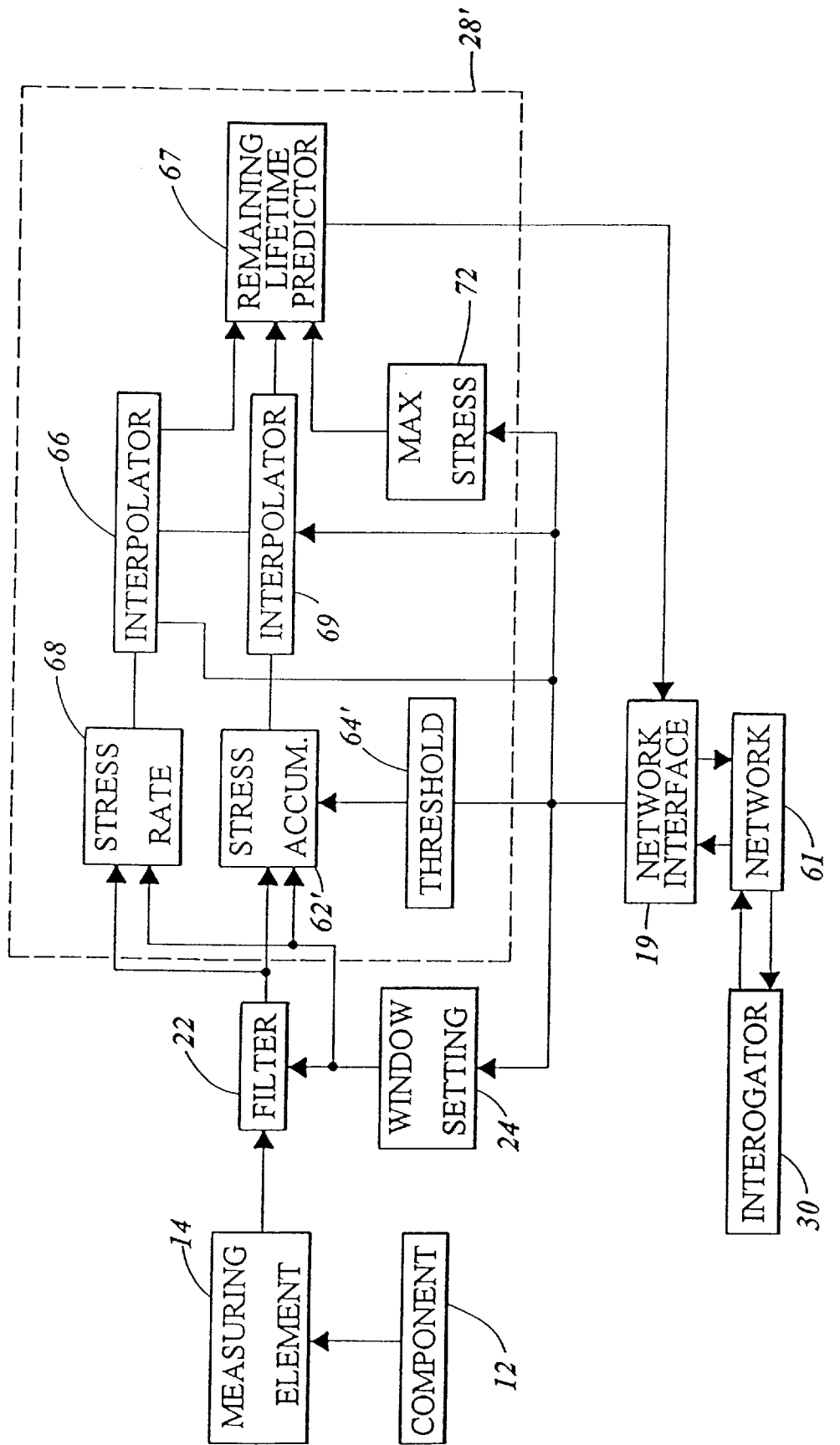
FIG. 4B shows an alternate architecture of the lifetime predictor of FIG. 2.

To address this difficulty, a preferred lifetime predictor 28', illustrated in FIG. 4B, evaluates the accumulated stress for several stress thresholds $\tau_k$ and interpolates the accumulated stress for those stress thresholds between $\tau_k$ and $\tau_k+1$. The preferred lifetime predictor 28' includes a stress accumulator 62' that outputs an array, accum\_stress$_k$, each element of which corresponds to a stress threshold $\tau_k$. By analogy with equation (8), the output of the stress accumulator 62' is thus a K-element accumulated-stress array whose $k_{th}$ element is given by:

$$\text{accum\_stress}_k = \sum_{i=1}^{N} (v_i - \tau_k)^n u(v_i - \tau_k) \quad (9)$$

where $\tau_k$ is one of K predefined stress thresholds stored in a stress-threshold register 64'. These K stress thresholds are generally set at the time that the window-settings register 24 receives its instructions from the interrogating agent 30.

The K-element accumulated-stress array, each element of which corresponds to a different stress threshold, is then passed to a first interpolator 69. In response to an interrogator-generated signal indicative of a desired stress threshold $\tau_d$, the first interpolator 69 estimates an accumulated stress value for the desired stress threshold $\tau_d$. If the desired stress threshold corresponds to one of the stress thresholds $\tau_k$, the first interpolator 69 simply retrieves the corresponding element from the accumulated-stress array. Otherwise, the first interpolator 69 estimates the accumulated stress on the basis of the values in the accumulated-stress array. One method of doing so is to linearly interpolate the accumulated stress for $\tau_d$, on the basis of accumulated stresses corresponding to neighboring stress thresholds. For example, if $\tau_k < \tau_d < \tau_{k+1}$, then the first interpolator 69 can generate the estimate:

$$\text{accum\_stress}_k + (\tau_d - \tau_k) \frac{\text{accum\_stress}_{k+1} - \text{accum\_stress}_k}{\tau_{k+1} - \tau_k} \quad (10)$$

However, other interpolation methods, potentially under the control of the interrogating agent 30 can also be used.

In the same way, the preferred lifetime predictor 28' of FIG. 4B evaluates the stress-rate for several stress thresholds $\tau_k$ and interpolates the stress-rate corresponding to the stress thresholds between $\tau_k$ and $\tau_k+1$. In the preferred lifetime predictor 28', the stress-rate evaluation module 68 provides an array of stress rates, stress\_rate$_k$ corresponding to each of the elements in the accumulated-stress array, accum\_stress$_k$. These individual elements of the stress-rate array are obtained by dividing each accumulated stress by the amount of time during which the measured value is in excess of the corresponding stress threshold. By analogy with equation (5), this is given by $$\text{stress\_rate}_k = \frac{\sum_{i=1}^{N} (v_i - \tau_k)^n u(v_i - \tau_k)}{\sum_{i=1}^{N} u(v_i - \tau_k)} \quad (11)$$

In response to an interrogator-generated signal representative of a desired stress threshold, $\tau_d$, a second interpolator 66 estimates a stress rate corresponding to the desired stress threshold. If the desired stress threshold corresponds to one of the predefined stress thresholds, $\tau_k$, the second interpolator 66 simply retrieves the corresponding element from the stress-rate array. Otherwise, the second interpolator 66 estimates a stress rate on the basis of stress rates obtained from the stress-rate array. This interpolation is performed using either a predetermined interpolation method or an interpolation method under the control of the interrogating agent 30. One such method is a linear interpolation method similar to that shown in equation (10) and implemented by the following when $\tau_k < \tau_d < \tau_{k+1}$:

$$\text{stress\_rate}_k + (\tau_d - \tau_k) \frac{\text{stress\_rate}_{k+1} - \text{stress\_rate}_k}{\tau_{k+1} - \tau_k} \quad (12)$$

The preferred lifetime predictor 28' shown in FIG. 4B thus provides the ability to adaptively estimate an accumulated stress value and stress-rate in response to a request from an interrogating agent 30 and to do so without the need to store a complete sequence of the measured variables $v_i$ and without the need to store accumulated values corresponding to the potentially infinite number of desired stress thresholds.

It will be appreciated that the stress accumulator 62' can implement definitions of accumulated stress other than those shown in equations (8) and (9). What is important is that the stress accumulator 62' provide a measure of stress experienced by a system component 12 over a defined period. For example, an alternative definition of the accumulated stress is:

$$\text{accum\_stress}_k = \sum_{i=1}^{N} (v_i - \tau_k)^n u(v_i - \tau_k) \quad (13)$$

It is apparent that the accumulated stress defined in equation (2) is merely a special case of that defined in equation (13), with n=1. It is also apparent that n need not be integer. For example, where the square root of the difference is of interest, n can be set to ½.

For some combinations of system components and interrogating agents, the accumulated stress can be a generalized polynomial of the form:

$$\text{accum\_stress}_k = \sum_{m=1}^{M} A_m \sum_{i=1}^{N} (v_i - \tau_k)^m u(v_i - \tau_k) \quad (14)$$

where the $A_m$ are predefined constants. It is apparent that equation (13) is likewise a special case of equation (14) in which $A_m=0$ for all M≠n and $A_m=1$ for m=n.

It will thus be seen that the invention efficiently attains the objects set forth above. Since certain changes may be made in the above constructions without departing from the scope of the invention, it is intended that all matter contained in the above description or shown in the accompanying drawings be interpreted as illustrative and not in a limiting sense.

It is also to be understood that the following claims are intended to cover all generic and specific features of the invention described herein, and all statements of the scope of the invention which as a matter of language might be said to fall therebetween. Having described the invention, What is claimed as new and secured by Letters Patent is:

1. A lifetime-prediction system for responding to a request from a remote interrogating agent to provide, to said remote interrogating agent, a predicted remaining-lifetime of a system component, said lifetime-prediction system comprising a measuring element in local communication with said system component for generating a measured-variable signal indicative of stress experienced by said system component, a local processor in local communication with said measuring element for generating a predicted remaining-lifetime on the basis of at least said measured-variable signal, the local processor comprising means for evaluating a cumulative stress, the means for evaluating said cumulative stress comprising, means for evaluating an extent to which said measured-variable signal exceeds a stress threshold, means for evaluating an exposure time during which said measured-variable signal exceeds said stress threshold, and, means for evaluating said cumulative stress on the basis of said extent and said exposure time, and, a network interface in communication with said local processor for enabling communication of said predicted remaining-lifetime between said local processor and said remote interrogating agent.

2. The system of claim 1 wherein said cumulative stress evaluation means comprises means for evaluating a cumulative difference between said measured variable signal and a stress threshold.

3. The system of claim 2 further comprising means for selecting said stress threshold in response to said request from said remote interrogating agent.

4. The system of claim 2 further comprising means for presetting said stress threshold.

5. The system of claim 2 further comprising means for selecting said stress threshold from a plurality of pre-selected thresholds.

6. The system of claim 2 further comprising non-volatile storage means for storing said stress thresholds.

7. The system of claim 2 further comprising non-volatile storage means for storing said cumulative difference.

8. The system of claim 1 wherein said extent evaluation means comprises means for evaluating a sum of terms in which each term is an nth degree polynomial in the extent to which said measured-variable signal exceeds said stress threshold.

9. The system of claim 1 wherein said extent is a first degree polynomial in the extent to which said measured-variable signal exceeds said threshold.

10. The system of claim 1 further comprising means for evaluating, on the basis of said measured-variable signal, a stress rate experienced by said system component.

11. The system of claim 10 wherein said stress rate evaluation means comprises means for excluding invalid values of said measured-variable signal from said stress rate evaluation.

12. The system of claim 10 further comprising means for generating a remaining lifetime estimate for said system component on the basis of at least said cumulative stress and said stress rate.

13. The system of claim 10 further comprising means for evaluating a difference between said cumulative stress and a maximum allowable accumulated stress, and means for generating a remaining lifetime estimate for said system component on the basis of a ratio of said difference and said stress rate.

14. The system of claim 1 further comprising means for generating a remaining lifetime estimate for said system component on the basis of at least said cumulative stress.

15. A lifetime-prediction system for responding to a request from a remote interrogating agent to provide, to said remote interrogating agent, an output signal indicative of a predicted remaining-lifetime of a system component, said lifetime-prediction system comprising a measuring element in local communication with said system component for monitoring a measured-variable signal indicative of stress experienced by said system component, a local processor in local communication with said measuring element for generating a predicted remaining-lifetime on the basis of at least said measured-variable signal, said local processor having means for measuring a time interval during which said measured-variable signal is in excess of a stress-threshold, means for evaluating a first extent to which said measured-variable signal has exceeded said stress threshold, means for evaluating, on the basis of said measured-variable signal and said time interval, a stress rate experienced by said system component, means for evaluating a second extent to which said first extent exceeds a maximum allowable accumulated stress, and means for generating a predicted remaining-lifetime for said system component on the basis of a ratio of said second extent and said stress rate, and a network interface in communication with said local processor for enabling communication between said local processor and said remote interrogating agent, thereby enabling communication of said predicted remaining-lifetime to said interrogating agent.

16. A method for providing, in response to a request from a remote interrogating agent, an output signal indicative of a remaining-lifetime predication of a system component, said method comprising the steps of monitoring, using a local communication channel, a measured-variable signal indicative of stress experienced by said system component, generating an output signal representative of a remaining-lifetime prediction on the basis of at least said measured-variable signal, further comprising evaluating, on the basis of at least said measured-variable signal, a cumulative stress experienced by said system component, wherein said evaluating a cumulative stress further comprises, evaluating an extent to which said measured-variable signal exceeds a threshold, evaluating an accumulated exposure time during which said measured-variable signal exceeds said stress threshold, and, evaluating said cumulative stress on the basis of said extent and said accumulated exposure time, and transmitting said output signal through a network interface to said remote interrogating agent.

17. The method of claim 16 wherein said step of evaluating a cumulative stress comprises the step of evaluating a cumulative difference between said measured-variable signal and a stress threshold.

18. The method of claim 17 further comprising the step of selecting said stress threshold in response to said request from said remote interrogating agent.

19. The method of claim 17 further comprising the step of presetting said stress threshold.

20. The method of claim 17 further comprising the step of selecting said stress threshold from a plurality of preselected thresholds.

21. The method of claim 17 further comprising the step of providing non-volatile storage means for storing said stress thresholds.

22. The method of claim 17 further comprising the step of providing non-volatile storage means for storing said cumulative difference.

23. The method of claim 16 wherein said step of evaluating an extent comprises the step of evaluating a sum of terms in which each term is an nth degree polynomial in the extent to which said measured-variable signal exceeds said stress threshold.

24. The method of claim 16 wherein said step of evaluating an extent comprises the step of evaluating a first degree polynomial in the extent to which said measured variable exceeds said threshold.

25. The method of claim 16 further comprising the step of evaluating, on the basis of said measured-variable signal, a stress rate experienced by said system component.

26. The method of claim 16 wherein said step of evaluating a stress rate comprises the step of excluding invalid values of said measured-variable signal from said stress rate evaluation.

27. The method of claim 16 further comprising the step of generating a remaining lifetime estimate for said system component on the basis of at least said cumulative stress.

28. The method of claim 16 further comprising the step of generating a remaining lifetime estimate for said system component on the basis of at least said cumulative stress and said stress rate.

29. The method of claim 16 further comprising the step of evaluating a difference between said cumulative stress and a maximum allowable accumulated stress, and means for generating a remaining lifetime estimate for said system component on the basis of a ratio of said difference and a stress rate.

30. A method for responding to a request from a remote interrogating a gent to provide, to said remote interrogating agent, an output signal indicative of a remaining-lifetime prediction of a system component, said method comprising the steps of monitoring, across a local communication channel, a measured-variable signal indicative of stress experienced by said system component, generating a remaining-lifetime prediction on the basis of at least said measured-variable signal, said generating step including the steps of measuring a time interval during which said measured-variable signal is in excess of a stress threshold, evaluating a first extent to which said measured-variable signal has exceeded a stress threshold, evaluating, on the basis of said measured-variable signal and said time interval, a stress rate experienced by said system component, evaluating a second extent to which said first extent exceeds a maximum allowable accumulated stress, and generating an output signal representative of a remaining lifetime prediction for said system component on the basis of a ratio of said second extent and said stress rate, and transmitting said output signal through a network interface to said remote interrogating agent.

31. A method for computing a remaining-lifetime predication of a system component, said method comprising, monitoring a measured-variable signal indicative of stress experienced by the system component, the measured-variable signal provided by a measurement element in communication with the system component, evaluating an extent to which said measured-variable signal exceeds a threshold, evaluating an accumulated exposure time during which said measured-variable signal exceeds said threshold, and, evaluating a cumulative stress on the basis of said extent and said accumulated exposure time.

32. A method for computing a remaining-lifetime prediction of a system component, said method comprising monitoring a measured-variable signal indicative of stress experienced by said system component, the measured-variable signal provided by a measurement element in communication with the system component, measuring a time interval during which said measured-variable signal is in excess of a stress threshold, evaluating a first extent to which said measured-variable signal has exceeded a stress threshold, evaluating, on the basis of said measured-variable signal and said time interval, a stress rate experienced by said system components, evaluating a second extent to which said first extent exceeds a maximum allowable accumulated stress, computing the remaining lifetime prediction for said system component on the basis of a ratio of said second extent and said stress rate.

33. A lifetime-prediction system for a system component, said lifetime-prediction system comprising a measuring element for monitoring a measured-variable signal indicative of stress experienced by said system component, the measured-variable signal provided by a measurement element in communication with the system component, means for measuring a time interval during which said measured-variable signal is in excess of a stress-threshold, means for evaluating a first extent to which said measured-variable signal has exceeded said stress threshold, means for evaluating, on the basis of said measured-variable signal and said time interval, a stress rate experienced by said system component, means for evaluating a second extent to which said first extent exceeds a maximum allowable accumulated stress, and, means for generating a predicted remaining-lifetime for said system component on the basis of a ratio of said second extent and said stress rate.

* * * * *